(12) United States Patent
Heath et al.

(10) Patent No.: US 8,641,912 B2
(45) Date of Patent: Feb. 4, 2014

(54) METHOD FOR FABRICATING MONOLITHIC TWO-DIMENSIONAL NANOSTRUCTURES

(75) Inventors: James R. Heath, South Pasadena, CA (US); Dunwei Wang, Boston, MA (US); Yuri Bunimovich, Williamsville, NY (US); Akram Boukai, Mountain View, CA (US)

(73) Assignee: California Institute of Technology, Pasadena, CA (US)

( * ) Notice: Subject to any disclaimer, the term of this patent is extended or adjusted under 35 U.S.C. 154(b) by 1319 days.

(21) Appl. No.: 12/125,043

(22) Filed: May 21, 2008

(65) Prior Publication Data
US 2009/0117741 A1 May 7, 2009

Related U.S. Application Data

(60) Provisional application No. 60/931,432, filed on May 23, 2007.

(51) Int. Cl.
*C23F 1/00* (2006.01)
*B44C 1/22* (2006.01)

(52) U.S. Cl.
USPC ............... 216/2; 216/41; 216/47; 977/842; 977/932

(58) Field of Classification Search
USPC .................. 216/2, 41, 47; 977/842, 932
See application file for complete search history.

(56) References Cited

U.S. PATENT DOCUMENTS

| | | | |
|---|---|---|---|
| 6,803,260 B2 | 10/2004 | Shin et al. | |
| 7,135,728 B2 * | 11/2006 | Duan et al. | 257/296 |
| 7,291,282 B2 * | 11/2007 | Tong | 216/40 |
| 2005/0133254 A1 * | 6/2005 | Tsakalakos | 174/261 |
| 2008/0019876 A1 * | 1/2008 | Chau et al. | 422/82.05 |

FOREIGN PATENT DOCUMENTS

| | | |
|---|---|---|
| EP | 1484644 | 12/2004 |
| EP | 1510848 | 3/2005 |

OTHER PUBLICATIONS

K. Xu et al. "Controlled fabrication of long quasione-dimensional superconducting nanowire arrays", Nano letters, vol. 8, No. 1, Dec. 6, 2007, pp. 136-141.
A. Husain, et al., "Nanowire-based very-high-frequency electromechanical resonator", Applied physics letters, vol. 83, No. 6, Aug. 11, 2003, pp. 1240-1242.
S.W. Chung, G. Markovich, J.R. Heath, "Fabrication and Alignment of Wires in Two-Dimensions," The Journal of Physical Chemistry B. 102. 6685 (1998).
Tao, A. ; Kim, F. ; Hess, C. ; Goldberger, J.; He, R.; Sun, Y.; Xia, Y.; Yang, P.; Langmuir Blodgett Silver Nanowire Monolayers for Molecular Sensing Using Surface-Enhanced Raman Spectroscopy. NanoLetters 3, 1229 (2003).
Huang, J.; Kim, F.: Tao, A.R., Connor, S.; Yang, P. Spontaneous formation of nanoparticle strip patterns through dewetting. Nature Materials vol. 4, p. 896 (2005).

(Continued)

*Primary Examiner* — Shamim Ahmed
(74) *Attorney, Agent, or Firm* — Steinfl & Bruno, LLP

(57) ABSTRACT

A patterning method for the creation of two-dimensional nanowire structures. Nanowire patterning methods are used with lithographical patterning approaches to form patterns in a layer of epoxy and resist material. These patterns are then transferred to an underlying thin film to produce a two-dimensional structure with desired characteristics.

21 Claims, 11 Drawing Sheets

(56) References Cited

OTHER PUBLICATIONS

Whang. D.: Jin, S.; Wu, Y.; Lieber, C.M. Large-Scale Hierarchical Organization of Nanowire Arrays for Integrated Nanosystems. NanoLetters 3, 1255-1259 (2003).

Wang, D.; Chang, Y.-L.; Zhuang, L.; Dai, H. Oxidation Resistant Germanium Nanowires: Bulk Synthesis, Long Chain Alkanethiol Functionalization, and Langmuir-Blodgett Assembly. Journal of the American Chemical Society, 127, 11871 (2005).

Michael Diehl, Rob Beckman, Sophia Yaliraki, and James R. Heath, "Self-Assembly of Deterministic Carbon Nanotube Wiring Networks," Angew. Chem. Int. Ed. 41, 353 (2002).

Nicholas Melosh, Akram Boukai, Frederic Diana, Brian Geradot, Antonio Badolato, Pierre Petroff, and James R. Heath, "Ultrahigh density Nanowire Lattices and Circuits," Science, 300, 112 (2003).

Choi, SH; Wang, KL; Leung, MS; Stupian, GW; and others. "Fabrication of nanometer size photoresist wire patterns with a silver nanocrystal shadowmask," J. Vac. Sci. & Tech. A- Vac. Surf. and Films, 17, 1425 (1999).

S. H. Choi, A. Khitun, K. L. Wang, M. S. Leung, G. W. Stupian, N. Presser, S. W. Chung, J. R Heath, A. Balandin, S. L. Cho and J. B. Ketterson, Fabrication of bismuth nanowires with a silver nanocrystal shadowmask, J. Vac. Sci. Tech. A- Vac. Surf. and Films, 18, 1236-1328 (2000).

R Beckman, E. Johnston-Halperin, Y. Luo, N. Melosh, J. Green, and J. R. Heath, "Fabrication of Conducting Silicon Nanowire Arrays," J. Appl. Phys. 96 (10), 5921-5923 (2004).

Jung, G.-H.; Johnston-Halperin, E.; Wu, W.; Yu, Z.; Wang, S.-Y.; Tong, W.M.; Li, Z.; Green, J.E.; Sheriff, B.A.; Boukai. A.; Bunimovich, Y.: Heath, J.R.; Williams, R.S. Circuit Fabrication at 17 nm Half-Pitch by Nanoimprint Lithography. NanoLetters, 6, 351 (2006).

Yang, C.; Zhong, Z.; Lieber, C.M. Encoding Electronic Properties by Synthesis of Axial Modulation Doped Silicon Nanowires. Science, 310, p. 1304 (2005).

Wu, Y.; Xiang, J.; Lu, W.; Lieber, C.M. Single-crystal metallic nanowires and metal/semiconductor nanowires heterostructures. Nature, 430. p. 61 (2004).

Weber, W.M.; Geelhar, L.; et al., Silicon-nanowire transistors with Intruded Nickel-Silicide Contacts. Nano Letters v. 6, p. 2660-2666 (2006).

Nanosphere Lithography: A Versatile Nanofabrication Tool for Studies of Size-Dependent Nanoparticle Optics, C. L. Haynes, R. P. Van Duyne, J. Phys. Chem. B, 105, 5599-5611 (2001).

Routkevitch, D.; Bigioni, T.; Moskovits, M. Electrochemical Fabrication of CdS nanowires arrays in porous anodic aluminum oxide templates. The Journal of Physical Chemistry, v. 100, p. 14037-14047 (1996).

Martin, C.R. Nanomaterials—A membrane based synthetic approach. Science, v. 266, p. 1961-1966 (Dec. 23 1994).

Zhou, J.; Xudong, W.; Song, J.; Tummala, R. ; Xu, N.S.; Wang, Z.L. Verticaly aligned Zn2SiO4 Nanotube/ZnO Nanowire Heterojunction Arrays. Small. v.3, p. 622-626 (2007).

Peng, K.; Zhang, M.; Lu, A.; Wong, N-B.; Zhang, R.; Lee, S.-T. Ordered silicon nanowire arrays via nanosphere lithography and metal induced etching. Applied Physics Letters, v.90, article # 163123 (2007).

She J.C.; Deng, S.Z.; Xu, N.S.; Yao, R.H.; Chen, J. Fabrication of vertically aligned Si nanowires and their application in a gated field emission device. Applied Physics Letters, v. 88, article # 013112 (2006).

Fan, S.; Chapline, M.; Franklin, N.; Tombler, T.; Cassell, A.; Dai, H. Self-Oriented, Regular Arrays of Carbon Nanotubes and their Field Emission Devices. Science, v. 283, p. 512 (Jan. 22, 1999).

D. Y. Li, Y. Y. Wu, P. Kim, L. Shi, P. D. Yang, A. Majumdar,Therrnal conductivity of individual silicon nanowires; Appl. Phys. Lett., 83, 2934 (Oct. 6, 2003).

Th. Agnes, Z. Guan, X.M. Li, Hi. Wolf and Th. Wichert, Doping of the nanocrystalline semiconductor zinc oxide with the donor indium, Amer Institute of Physics, vol. 83, No. 6, 1204, (Aug. 11, 2003).

PCT Search Report for PCT/US2008/064439 in the name of California Institute of Technology filed on May 21, 2008.

PCT Written Opinion for PCT/US2008/064439 in the name of California Institute of Technology filed on May 21, 2008.

Yablonovitch, E., Photonic band-gap structures, J. Opt. Soc. Am. B. 1993, 10: 283 -297.

Beckman, R., et al., Bridging Dimensions: Demultiplexing Ultrahigh-Density Nanowire Circuits, Science 2005, 310: 465—468.

Bunimovich, Y., et al., Quantitative Real-Time Measurements of DNA Hybridization with Alkylated Nonoxidized Silicon Nanowires in Electrolyte Solution, JACS 2006, 128: 16323—16331.

Collier, CP, et al., Nanocrystal Superlattices, Annu. Rev. Phys. Chem. 1998, 49: 371—404.

Green, J., et al., A 160-kilobit molecular electronic memory patterned at 1011 bits per square centimeter, Nature 2007, 445: 414—417.

Heath, Jr, et al., Pressure/Temperature Phase Diagrams and Superlattices of Organically Functionalized Metal Nanocrystal Monolayers: The Influence of Particle Size, Size Distribution, and Surface Passivant, J. Phys. Chem. B 1997, 101: 189—197.

Heath, Jr, et al., A Defect-Tolerant Computer Architecture: Opportunities for Nanotechnology, Science 1998, 280: 1716—1721.

Hulteen, JC., et al., Nanosphere lithography: A materials general fabrication process for periodic particle array surfaces, J. Vac. Sci. Technol. 1995, 13: 1553—1558.

Joannopoulos, JD, et al., Photonic crystals: putting a new twist on light, Nature 1997, 386: 143—149.

Wang, D., et al., Surface Chemistry and Electrical Properties of Germanium Nanowires, JACS 2004, 126: 11602—11611.

Wang, D., et al., Complementary Symmetry Silicon Nanowire Logic: Power-Efficient Inverters with Gain**, Small 2006, 2: 1153—1158.

Wang, D., et al., Silicon p-FETs from Ultrahigh Density Nanowire Arrays, Nano Letters 2006, 6: 1096—1100.

Yang, C., et al., Single p-Type/Intrinsic/n-TypeSilicon Nanowires as Nanoscale Avalanche Photodetectors, Nano Letters 2006, 6: 2929—2934.

Zhong, Z., et al., Nanowire Crossbar Arrays as Address Decoders for Integrated Nanosystems, Science 2003, 302: 1377—1379.

Qiu, M., et al., Large complete band gap in two-dimensional photonic crystals with elliptic air holes, Physical Review B 1999, 60: 10 610—10 612.

Vossmeyer, T., et al., Light-directed assembly of nanoparticles, Angew. Chem. Int. Ed. Engl. 1997, 36: 1080—1083.

* cited by examiner

METHOD FOR FABRICATING MONOLITHIC TWO-DIMENSIONAL NANOSTRUCTURES

CROSS-REFERENCE TO RELATED APPLICATIONS

The present application is related to and claims the benefit of commonly assigned U.S. Patent Application No. 60/931,432, titled "Fabricating Monolithic Two-Dimensional Si Nanostructures," filed on May 23, 2007, the entire contents of which are incorporated herein by reference.

STATEMENT REGARDING FEDERALLY SPONSORED RESEARCH OR DEVELOPMENT

The U.S. Government has certain rights in this invention pursuant to Grant No. HR0011-04-3-0038 awarded by DARPA.

BACKGROUND

1. Field

This disclosure relates to nanowire assembly methods. More specifically, the present disclosure describes methods for nanowire patterning and assembly methods to form circuits and other structures.

2. Description of Related Art

Nanowires are a class of materials in which the diameter or width of the nanowires itself varies from a few nanometers to a few tens of nanometers. Such dimensions may not be readily accessible using conventional lithographic patterning methods, but may be made accessible using nanowire patterning or nanowire materials growth methods. Typically, nanowires have a length that is at least 10 times larger than the width or diameter dimensions. In some cases, the nanowires length can be 1000 times (or more) larger than the width or diameter. While nanowires have a number of electronic applications that may not be shared by larger submicrometer or micrometer scale wires, the use of nanowires in electrical applications have several limitations.

First, it may not be easy to assemble nanowires into desired electrical circuit architectures. Most electrical circuit architectures can be optimized if the electronic components themselves can be organized with arbitrary complexity. However, practically all methods for arranging nanowires known in the art result in simple, periodic arrangements of the nanowires, such as arrays of nanowires aligned side-by-side.

Second, establishing electrical contact to nanowires may be difficult. A high quality electrical contact is described as an ohmic contact, meaning that electrical current through the contact varies linearly with the applied voltage (i.e., follows Ohm's law). Electrical contacts typically involve attaching metal electrodes onto the nanowires. In the general case, the metal electrodes and the nanowires are made out of different materials, and the nanowires may be semiconducting, while the metal electrodes are metallic. Also, in the general case, this materials mismatch between the nanowires and the contacting electrode material means that the two contacting electrode materials and the nanowires are characterized by different work functions. This leads to a barrier to current flow at the contact—this barrier is called a Schottky barrier. The barrier leads to a non-ohmic contact. There is no general approach to establish ohmic electric contacts to nanowires.

As indicated, establishing good electrical contacts between different materials is generally difficult, and is generally more difficult when one of the materials is a nanowire. If the nanowires are very heavily doped with impurities, then they can exhibit metallic behavior, and contacts to such nanowires will usually be ohmic. However, for nanowires that are lightly doped, as is required for field-effect transistors, chemical sensing, thermoelectric, and other applications, ohmic contacts to the nanowires are much more difficult to achieve. In addition, semiconductor nanowires can be either p-type or n-type conductors, and if a method is found to establish an ohmic contact to a p-type nanowires, for example, it does not follow that the same method will work for n-type nanowires.

Another application in which electrical contacts can play critical roles include the electrical contacts to superconducting materials. In many cases, proximity effects can dominate the observed response—this means that the superconducting properties of the nanowires can be dominated by the superconducting properties of the contacts, not of the nanowires themselves.

Methods for assembling or patterning nanowires to form periodic structures that are horizontally aligned with the surface of the supporting substrate are known in the art. The following literature provides representative examples of forming arrays of horizontally aligned nanowires:

1. S. W. Chung, G. Markovich, J. R. Heath, "Fabrication and Alignment of Wires in Two-Dimensions," The Journal of Physical Chemistry B. 102, 6685 (1998).
2. Tao, A.; Kim, F.; Hess, C.; Goldberger, J.; He, R.; Sun, Y.; Xia, Y.; Yang, P.; Langmuir Blodgett Silver Nanowire Monolayers for Molecular Sensing Using Surface-Enhanced Raman Spectroscopy. NanoLetters 3, 1229 (2003).
3. Huang, J.; Kim, F.; Tao, A. R., Connor, S.; Yang, P. Spontaneous formation of nanoparticle strip patterns through dewetting. Nature Materials vol. 4, p. 896 (2005).
4. Whang, D.; Jin, S.; Wu, Y.; Lieber, C. M. Large-Scale Hierarchical Organization of Nanowire Arrays for Integrated Nanosystems. NanoLetters 3, 1255-1259 (2003).
5. Wang, D.; Chang, Y.-L.; Zhuang, L.; Dai, H. Oxidation Resistant Germanium Nanowires Bulk Synthesis, Long Chain Alkanethiol Functionalization, and Langmuir-Blodgett Assembly. Journal of the American Chemical Society, 127, 11871 (2005).
6. Michael Diehl, Rob Beckman, Sophia Yaliraki, and James R. Heath, "Self-Assembly of Deterministic Carbon Nanotube Wiring Networks," Angew. Chem. Int. Ed. 41, 353 (2002).
7. Nicholas Melosh, Akram Boukai, Frederic Diana, Brian Geradot, Antonio Badolato, Pierre Petroff, and James R. Heath, "Ultrahigh density Nanowire Lattices and Circuits," Science, 300, 112 (2003).

Nanowires may serve as etch masks so that the length and width dimensions of the nanowires, as long as the relative positions of the nanowires, may be translated to underlying materials to create nanowires in the underlying material. The height of the nanowires in the underlying material may be determined by the thickness of that material or by the depth that is achieved in the etching process. Examples of using nanowires as etch masks are provided is the following literature:

8. Choi, S H; Wang, K L; Leung, M S; Stupian, G W; and others. "Fabrication of nanometer size photoresist wire patterns with a silver nanocrystal shadowmask," J. Vac. Sci. & Tech. A-Vac. Surf. And Films, 17, 1425 (1999).
9. S. H. Choi, A. Khitun, K. L. Wang, M. S. Leung, G. W. Stupian, N. Presser, S. W. Chung, J. R. Heath, A. Balandin, S. L. Cho and J. B. Ketterson, "Fabrication of bismuth nanowires with a silver nanocrystal shadowmask, J. Vac. Sci. Tech. A-Vac. Surf. And Films, 18, 1236-1328 (2000).

10. R Beckman, E. Johnston-Halperin, Y. Luo, N. Melosh, J. Green, and J. R. Heath, "Fabrication of Conducting Silicon Nanowire Arrays," J. Appl. Phys. 96 (10), 5921-5923 (2004).
11. Jung, G.-H.; Johnston-Halperin, E.; Wu, W.; Yu, Z.; Wang, S.-Y.; Tong, W. M.; Li, Z.; Green, J. E.; Sheriff, B. A.; Boukai, A.; Bunimovich, Y.; Heath, J. R.; Williams, R. S. Circuit Fabrication at 17 nm Half-Pitch by Nanoimprint Lithography. NanoLetters, 6, 351 (2006).

As indicated above, the establishment of ohmic contacts may be needed for the desired performance of a circuit or system. The following literature discusses the establishment of ohmic contacts for nanowires:

12. Yang, C.; Zhong, Z.; Lieber, C. M. Encoding Electronic Properties by Synthesis of Axial Modulation Doped Silicon Nanowires. Science, 310, p. 1304 (2005).
13. Wu, Y.; Xiang, J.; Lu, W.; Lieber, C. M. Single-crystal metallic nanowires and metal/semiconductor nanowires heterostructures. Nature, 430. p. 61 (2004).
14. Weber, W. M.; Geelhar, L.; et al., Silicon-nanowire transistors with Intruded Nickel-Silicide Contacts. Nano Letters v. 6, p. 2660-2666 (2006).

Methods for the creation of nanopatterned films have been described in the art. Such methods include the utilization of closest packed arrays of spheres as masks for materials deposition. When a material is deposited onto the surface of an array of spheres, the region in between the spheres is also coated. The result is a patterned array of small particles. The size of those particles is dependent upon the way in which the material is deposited, and the size of the spheres that are used as masks. Another method for achieving nano-patterned substrates with extremely small feature sizes is to prepare an anodically etched alumina film. The resultant etched film may be characterized by a periodic array of holes that are controlled with respect to their size and their separation. These holes (or channels) may then be used as templates for depositing nanowire materials. Literature describing such methods includes the following papers:

15. "Nanosphere Lithography: A Versatile Nanofabrication Tool for Studies of Size-Dependent Nanoparticle Optics", C. L. Haynes, R. P. Van Duyne, J. Phys. Chem. B, 105, 5599-5611(2001).
16. Routkevitch, D.; Bigioni, T.; Moskovits, M. Electrochemical Fabrication of CdS nanowires arrays in porous anodic aluminum oxide templates. The Journal of Physical Chemistry, v. 100, p. 14037-14047 (1996).
17. Martin, C. R. Nanomaterials—A membrane based synthetic approach. Science, v. 266, p. 1961-1966 (1994).

Methods for producing arrays of vertically aligned nanowires have been reported in the literature. Typically, such methods are limited to either semiconductor nanowires that are nucleated and grown from a metal nanoparticle seed, or carbon nanotubes that are similarly nucleated and grown. Literature that describes such methods includes:

18. Zhou, J.; Xudong, W.; Song, J.; Tummala, R.; Xu, N. S.; Wang, Z. L. Verticaly aligned Zn2SiO4 Nanotube/ZnO Nanowire Heterojunction Arrays. Small, v. 3, p. 622-626 (2007).
19. Peng, K.; Zhang, M.; Lu, A.; Wong, N-B.; Zhang, R.; Lee, S.-T. Ordered silicon nanowire arrays via nanosphere lithography and metal induced etching. Applied Physics Letters, v. 90, article # 163123 (2007).
20. She, J. C.; Deng, S. Z.; Xu, N. S.; Yao, R. H.; Chen, J. Fabrication of vertically aligned Si nanowires and their application in a gated field emission device. Applied Physics Letters, v. 88, article # 013112 (2006).
21. Fan, S.; Chapline, M.; Franklin, N.; Tombler, T.; Cassell, A.; Dai, H. Self-Oriented Regular Arrays of Carbon Nanotubes and their Field Emission Devices. Science, v. 283, p. 512 (1999).

One application of nanowire structures is the creation of suspended nanowires. Suspended nanowires may be used, for example, in high-frequency nanomechanical resonators or for thermal properties measurements. Arrays of suspended nanowires can have superior signal-to-noise performance over individual nanowires, but may be difficult to suspend because the nanowires themselves can exhibit strong nanowire-nanowire interactions that can cause the structure to collapse. In addition, for high frequency resonator applications, the frequency of the resonator depends upon the structural characteristics of the nanowires—for example, shorter nanowires are higher frequency resonators, if all other structural and materials aspects are kept the same. Literature that discusses suspended nanowires includes the following papers:

22. D. Y. Li, Y. Y. Wu, P. Kim, L. Shi, P. D. Yang, A. Majumdar, Appl. Phys. Lett. 2003, 83, 2934.
23. A. Husain, J. Hone, H. W. C. Postma, X. M. H. Huang, T. Drake, M. Barbic, A. Scherer, M. L. Roukes, Appl. Phys. Lett. 2003, 83, 1240.

SUMMARY

Methods for generating two-dimensional structures at sub-lithographic dimensions are described below. One dimension may comprise ultra-high density nanowire arrays created by nanowire fabrication processes while the other dimension may comprise lithographically patterned structures or another array of nanowires by nanowire fabrication processes. The fabricated nanowires may be deposited on a layer consisting of a mix of polymethylmethacrylate (PMMA) or other photo-resist material and epoxy, which may serve as both an adhesive for the deposited nanowires and support lithographical patterning. The fabricated two-dimensional structures may then provide structures with reliable electrical contacts to nanowire devices, or structures that allow for the suspension of high density nanowire arrays, structures that provide two-dimensional photonic-like single crystals, or structures having other useful characteristics.

Nanowires less than 20 nm in width are attractive building blocks for advanced electronic devices, but the small sizes may impose challenges in forming reliable electrical contacts using metal pads due to high surface sensitivity unique to nanowires. Methods described below provide for connecting nanowires with monolithic Si bars that may all be in a single crystalline film. Metal pads may then be connected to the Si bar allowing for high quality and reliable contacts. The Si bars may be defined using lithographic methods and can serve as routing connections between nanowires. Hence, the methods described below may be used to form truly integrated nanowire circuits where all internal connections may be confined within a single crystalline structure.

Doping profile may plan an important role in the performance of nanowire transistors. High doping level favors high quality electrical contacts but yields poor gate modulation while low doping may provide good gate switching, but result in difficulties in forming good contacts. Methods described below incorporate selective etching to form inhomogeneous doping profiles, i.e., high doping in contact regions and low doping in channels. The doping techniques used may result in the dopants residing on the nanowire surfaces. After electrical contacts are formed to the heavily doped nanowires, the surface of the channel may be etched to remove the top layers of atoms. Hence, low doping in the channel region may be achieved while retaining high doping in the contact regions.

Ultra-high density nanowire arrays may be suspended as active components for elements such as high frequency resonators. When suspended, adjacent nanowires in an array tend to bond to each other due to Van der Walls forces. Methods described below provide for the formation of monolithic bars to hold nanowires in a high density array. The connections may be single crystalline in nature, where the rigidity of the crystal helps clamp nanowires in the array.

Nanowire arrays can be produce at extremely high density with great regularity. Methods described below allow for the creation of single crystal structures with sublithographic defects spaced regularly. To serve as photonic like crystals or as perturbations to phonon modes in solid state devices, the defects are preferably regularly spaced at nanometer scales. Methods described below provide for such structures in Si crystal and other crystals.

An embodiment of the present disclosure is a method for fabricating two dimensional nanostructures comprising the steps of: depositing nanowires on a patterning layer, where the patterning layer is positioned on top of a thin film layer; forming patterns in the patterning layer to form two-dimensional structures in the patterning layer, where the two-dimensional structures comprise the nanostructures and the formed patterns; and etching the one or more structures into the thin film layer. The patterning layer preferably comprises a thin layer of epoxy and photo-resist material that supports electron beam lithography or photolithography. As indicated, the thin film layer will be etched to provide the resulting two-dimensional nanostructure. The thin film layer may comprise Si and may be doped to provide additional capabilities as described below. Structures with superconducting capabilities may be formed with the use of niobium in the thin film layer. The nanowires may be formed and deposited using a Superlattice Nanowire Pattern Transfer method or other methods known in the art.

Another embodiment of the present disclosure is a method for fabricating two dimensional nanostructures comprising the steps of: depositing a first nanowire array on a patterning layer, where the patterning layer is disposed on a thin film layer and the first nanowire array comprises a plurality of nanowires aligned generally parallel to each other; depositing a second nanowire array on top of the first nanowire array and the second nanowire array comprises a plurality of nanowires aligned generally parallel to each other; and etching one or more two-dimensional structures resulting from a combination of the first nanowire array and the second nanowire array on the patterning layer into the thin film layer. Preferably, the patterning layer comprises a thin layer of epoxy and photo-resist material that supports electron beam lithography or photolithography. The nanowires may be Pt nanowires and may be formed and deposited using a Superlattice Nanowire Pattern Transfer method or other methods known in the art.

Still another embodiment of the present disclosure is method for fabricating two dimensional nanostructures comprising the steps of: depositing one or more nanowires on a adhesion and resist layer, where the adhesion and resist layer is disposed on layer that will provide the resulting nanostructures (i.e., a resulting nanostructure layer); forming patterns in the adhesion and resist layer to form one or more two-dimensional structures in the adhesion and resist layer, where the one or more structures comprise the formed patterns and the one or more nanowires; copying the two-dimensional structures in the adhesion and resist layer to the resulting nanostructure layer; and removing material in the resulting nanostructure layer outside of the copied two-dimensional structures. The adhesion and resist layer may comprise a thin layer containing a mix of epoxy and photo-resist material. The resulting nanostructure layer may comprise a doped or undoped Si epilayer, a niobium film, or a layer of other material conducive to the formation of nanostructures.

Embodiments of the present disclosure are more particularly described in the following examples that are intended as illustrative only since numerous modifications and variations therein may be apparent to those skilled in the art. As used in the specification and in the claims, "a," "an," and "the" can mean one or more, depending upon the context in which it is used. Several embodiments of the present disclosure are now described with reference to the figures, in which like numbers indicate like parts throughout the figures.

DETAILED DESCRIPTION

Nanowire materials, which can exhibit unique and useful properties because of their small dimensions, can typically only be assembled or patterned to form periodic, simple structures. Such simple structures are often inappropriate, not optimal, or not useful for an application of interest. On the other hand, lithographic patterning may be utilized to produce arbitrarily complex patterns, as required by an application of interest. However, lithographic patterning does not resolve the same nanoscale dimensions and nanostructure packing densities that can be achieved using nanowire patterning or assembly methods. As described below, embodiments of the present disclosure provide for the fabrication of structures that can include nanowires with electrical contacts and arbitrarily complex signal routing and interconnect patterns. Embodiments of the present disclosure may also provide that all structures be fabricated from the same material, or even the same single crystal. Embodiments of the present disclosure allow for the nanowires within the structures to be made from a broad class of materials types, including metal, insulator, semiconductor, and superconductor nanowires.

Figure 1A:
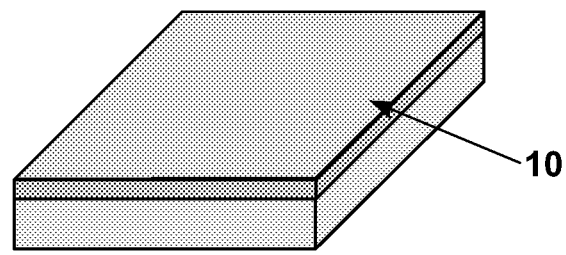
FIGS. 1A-1D illustrate a method for forming a two-dimensional nanostructure.
Figure 1B:
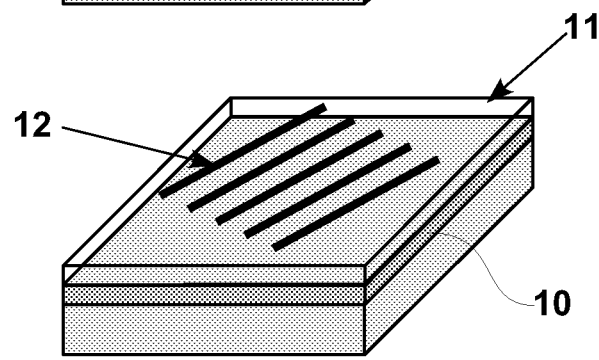

FIGS. 1A-1D illustrate a method for forming a two-dimensional nanostructure according to an embodiment of the present disclosure. In FIG. 1A, a thin film 10 from which the final nanowires circuit will be formed is prepared. The characteristics of that thin film 10, such as its thickness, the level of impurity (dopant) atoms, the crystal structure and orientation, etc., will all be transferred to the final nanowires based circuit. FIG. 1B shows the film 10 then coated with a thin layer 11 of epoxy and electron beam lithography or photolithography material. FIG. 1B further shows the assembly or deposition of nanowires 12 on top of the epoxy/resist thin film 11. The epoxy helps the nanowires 12 to adhere, while the resist material allows for lithographic patterning to be done on this layer. The assembled nanowires 12 will serve as the template for the final nanowires-based circuit structure.

Figure 1C:
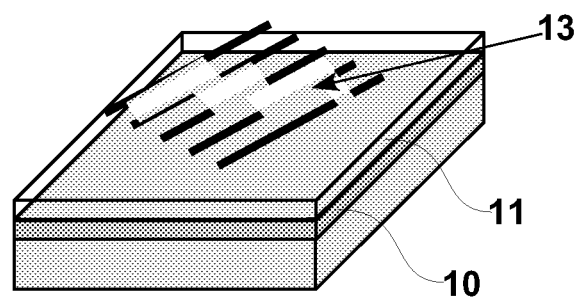
Figure 1D:
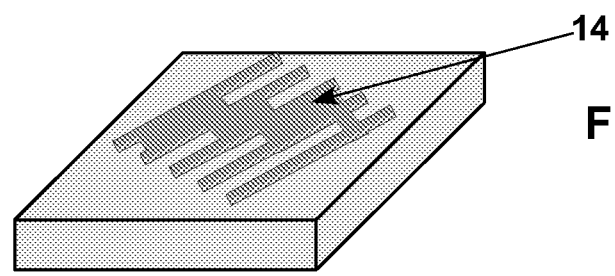

FIG. 1C shows the use of lithographic patterning to pattern an additional structure 13 of electrical contacts, signal routing pathways, etc., into the epoxy/resist thin film 11. FIG. 1D shows the copying of the entire nanowire assembly 12 and patterned structure 13 shown in FIG. 1C into the underlying thin film 10 using etching procedures to produce a circuit 14 or other structure that contains features of both the nanowire assembly 12 and the pattern structure 13, i.e., both dimensions.

Figure 2:
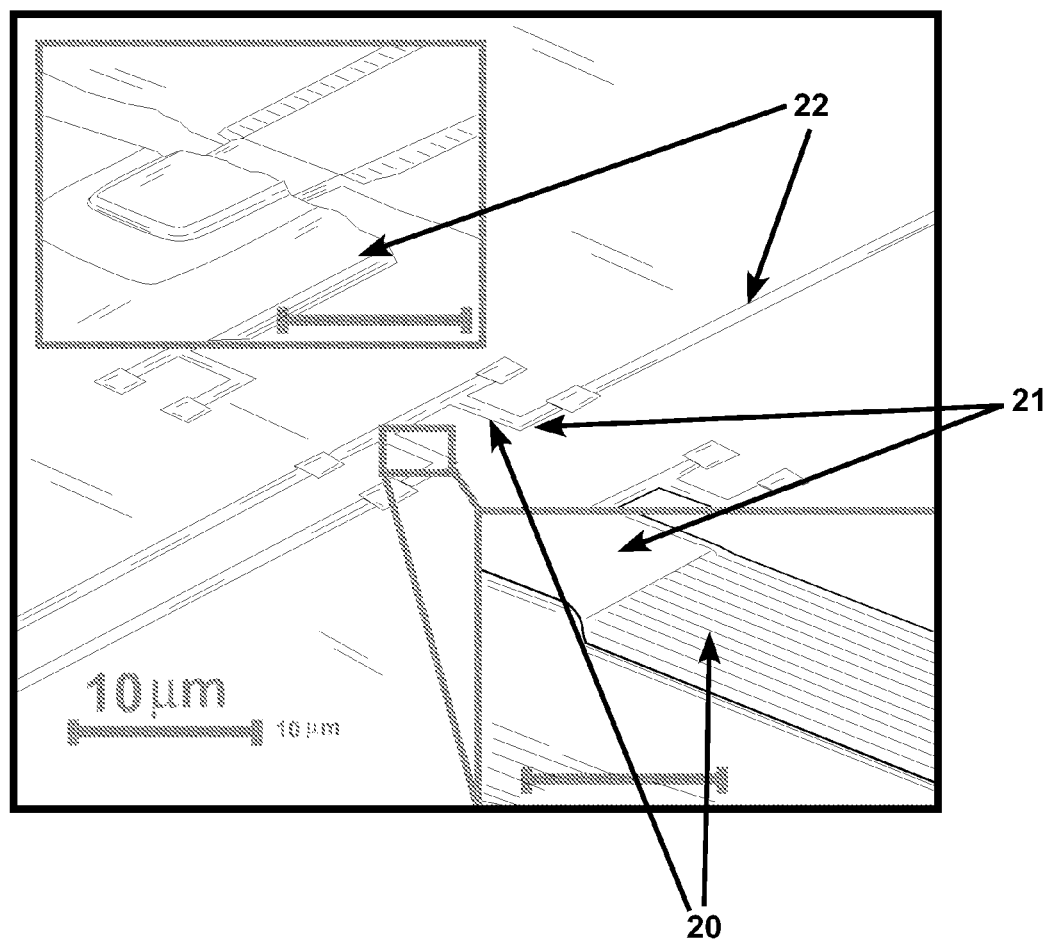
FIG. 2 is a scanning electron micrograph of a complementary symmetry inverter FET logic circuit.

FIG. 2 illustrates an application of on an embodiment of the present disclosure for the formation of an electronic circuit based upon nanowire field-effect transistor switching elements. It also illustrates the use of an embodiment of the present disclosure to establish ohmic contacts to nanowires. FIG. 2 is a scanning electron micrograph of a logic circuit comprising a complementary symmetry inverter. This is a Boolean logic gate that turns a logical '1' into a '0' and a logical '0' into a '1'. This particular circuit involves two types of silicon nanowire transistors—one in which the transistor is doped with p-type impurities, and the other in which the transistor is doped with n-type impurities. For this circuit, the nanowires are preferably assembled into an array of aligned nanowires, with some of the nanowires p-type doped, and others n-type doped. None of the nanowires touches any other nanowires, or is in any way contacted to any other nanostructure or microstructure. Using existing art, it may be difficult to establish ohmic electrical contacts to both the p-type and n-type nanowires. Without such ohmic contacts, the circuit performance may not be as desired.

Using methods as provided by an embodiment of the disclosure, silicon nanowire arrays 20 are contacted by submicron silicon pads 21—the pads and the nanowires preferably comprise different parts of the same single crystal of silicon 10. The pads 21, in turn, are contacted to metallic electrodes 22. Ohmic contacts to the large pads 21 are preferred, but these are much easier to establish than ohmic contacts to nanowires 20. While the relatively larger area of the pads 21 helps in assisting the formation of ohmic contacts, in addition, the silicon pads 21 may be doped at a higher level than are the nanowires 20, thus further facilitating an ohmic contact. In addition, the submicron contact pads 21 are also structured so that the routing contacts between the two types of nanowires transistors are established in an efficient manner—again, all from the same single crystal thin film of silicon.

Figure 3A:
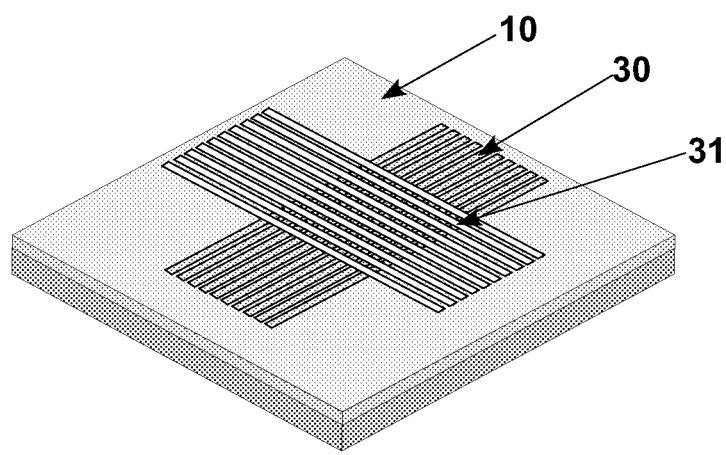
FIGS. 3A and 3B illustrate a method for the translation of multiple nanostructure patterns into a single nanostructure.
Figure 3B:
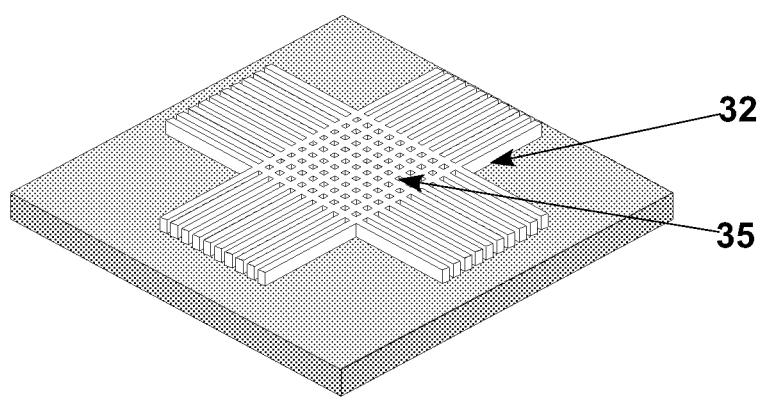

Embodiments of the present disclosure also provide for patterning non-nanowire based periodic structures at dimensions that are typically not achievable using lithographic patterning approaches. Although certain types of periodic structures with nanoscale dimensions can be fabricated using other methods, none of those other methods is generally applicable to a very broad set of materials. Embodiments of the present disclosure are applicable to a very broad set of materials. Embodiments of the present disclosure allow for multiple nanostructure patterns to be simultaneously translated into a single nanostructure. FIGS. 3A and 3B illustrates the translation of multiple nanostructure patterns into a single nanostructure.

Figure 3C:
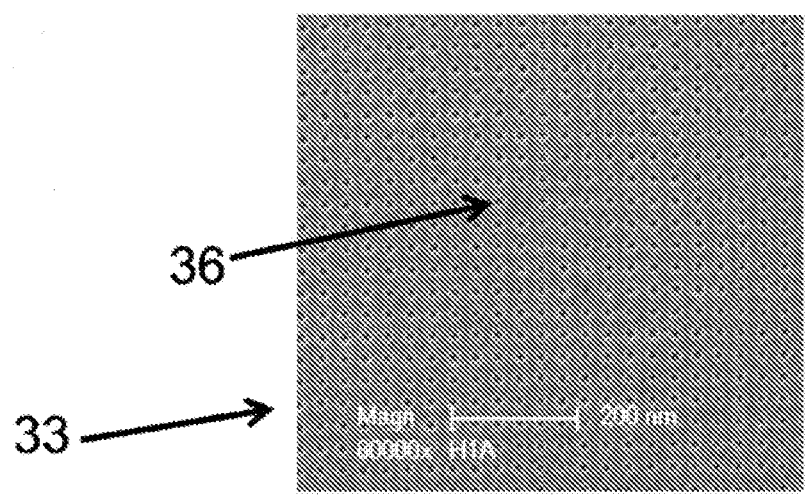
FIGS. 3C and 3D are micrographs of structures resulting from the method depicted in FIGS. 3A and 3B.
Figure 3D:
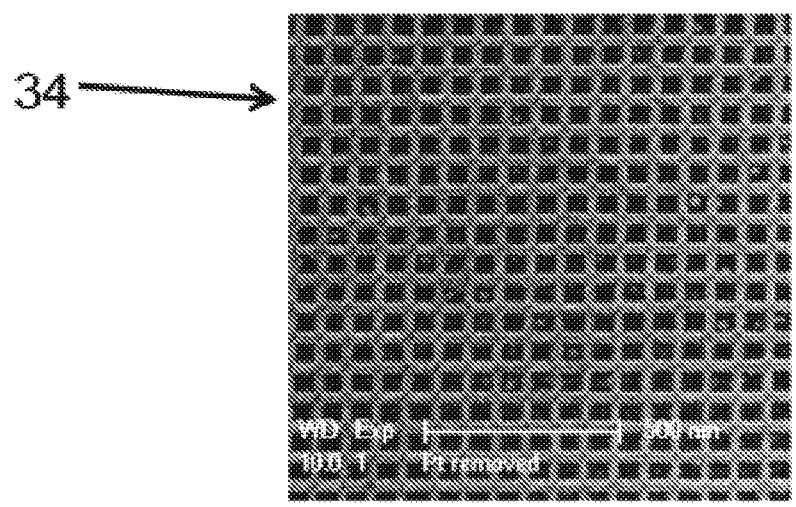

In FIG. 3A, two nanowires assemblies are deposited. The first nanowire assembly 30 is deposited onto the substrate 10 and the second nanowire assembly 31 is deposited on top of the first assembly 30, with a particular orientation. As shown in FIG. 3B, using these two nanowires arrays 30, 31 as a single etch mask, a single nanostructure 32 that represents the additive pattern of both nanowires arrays 30, 31 is produced. Depending upon how the nanowires are assembled, the final nanostructure 32 can be prepared with extremely high precision. FIG. 3C shows a micrograph of a resulting structure 32 with a lattice of small holes. FIG. 3D shows a micrograph of a resulting structure 32 with a larger spacing in the lattice. Of course many other types of patterns are possible using embodiments of the present disclosure.

It is occasionally useful to be able to place defects within nanostructured periodic arrays. Defects can include, for example, lattice irregularities where a hole is absent in an otherwise perfect lattice of holes. When such a defect is desired, it is also desirable to place that defect precisely in a particular spot. Embodiments of the present disclosure allow for the placement of such defects. FIG. 3C illustrates the placement of such a defect by the missing hole 36.

Figure 4A:
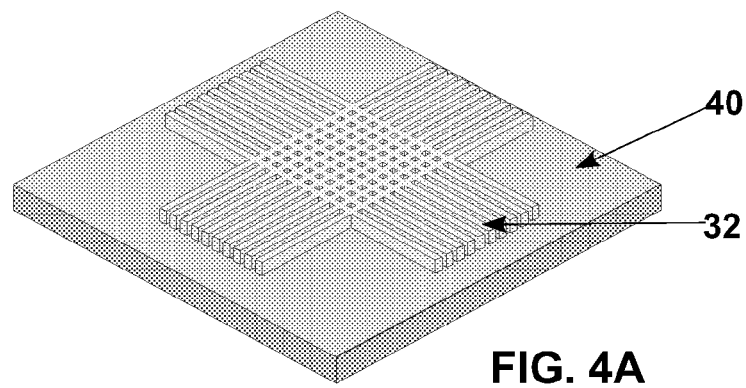
FIGS. 4A-4C illustrate the formation of vertically aligned arrays of nanowires.
Figure 4B:
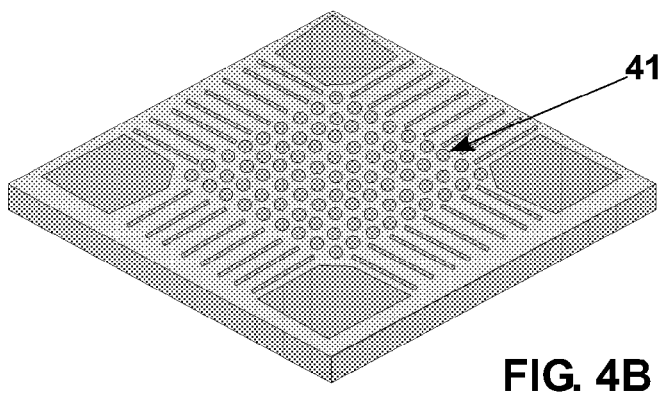
Figure 4C:
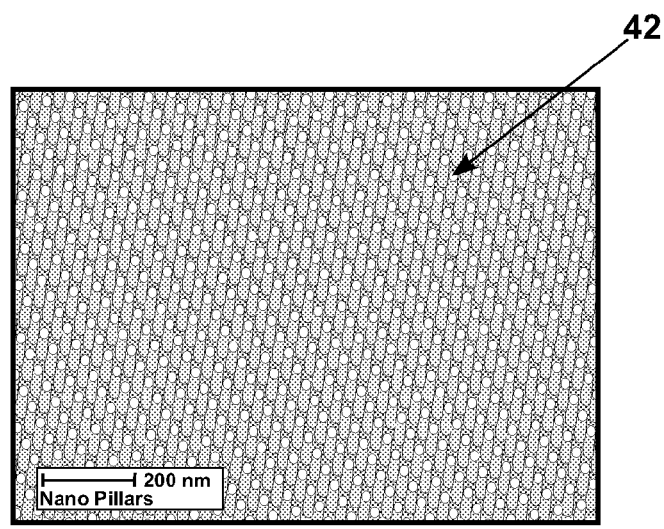

Embodiments of the present disclosure provide for the production of vertically aligned arrays of nanowires at high densities. Such embodiments can produce nanowires of many different types, and the nanowires are etched out of a thin film. FIGS. 4A, 4B, and 4C illustrate the creation of such vertically aligned arrays.

FIG. 4A shows a patterned nanostructure 32 produced using embodiments of the present disclosure as described above. As described above, the patterned nanostructure may comprise a pattern etched into an Si layer. A thin metal film 40 is then deposited on top of the nanostructure 32. FIG. 4B illustrates the removal of the nanostructure 32, which leaves behind a patterned thin metallic film 41. When the nanostructure 32 itself is selectively removed using wet or dry etching techniques, the patterned thin metallic film 41 obtains, essentially, a negative of the pattern of the nanostructure 32. This patterned metal film 41 may then serve as an etch mask—the regions under the metal patterns are not etched, while everything else is. The etch mask may then be used to etch a layer disposed beneath the original Si layer in which the patterned nanostructure was created. For example, using the pattern 41 shown as shown in FIG. 4B, it is possible to prepare large arrays of vertically aligned nanowires 42 shown in FIG. 4C out of almost any material. As briefly discussed above, while the nanostructure 32 may have been fashioned from Si, a layer underlying the Si nanostructure layer may be another material. The arrays can also be produced with a very high packing density (~30% or greater). Arrays of this type may find applications for thermoelectric cooling or thermoelectric power generation applications, field emission tips for visual display technologies, or light harvesting devices.

Formation of a two-dimensional silicon nanostructure according to an embodiment of the present disclosure is described in additional detail below. According to this embodiment, nanowires are first prepared and transferred using the Superlattice Nanowire Pattern Transfer (SNAP) method as described in Reference #7 listed above. Other embodiments according to the present disclosure may use other methods for the preparation and transfer of nanowires, such as those described in References #1 to #6 listed above.

The SNAP method translates the width and spacings of thin films within a multi-thin film superlattice structure into nanowires width and pitch within a nanowires array. First, a custom-grown $Al_xGa_{(1-x)}As$/GaAs superlattice is cleaved into 2 mm wide×5 mm long 'masters'. One of the 2 mm wide edges is an atomically flat {110} or {100} plane. As viewed on the edge of the superlattice, a comb-like structure is generated by differentially etching the superlattice using a dilute $NH_4OH/H_2O_2/H_2O$ etch solution. Pt metal is then deposited onto the superlattice edge at an angle that varies from 15° to 45°, depending upon the pitch of the superlattice.

Figure 5A:
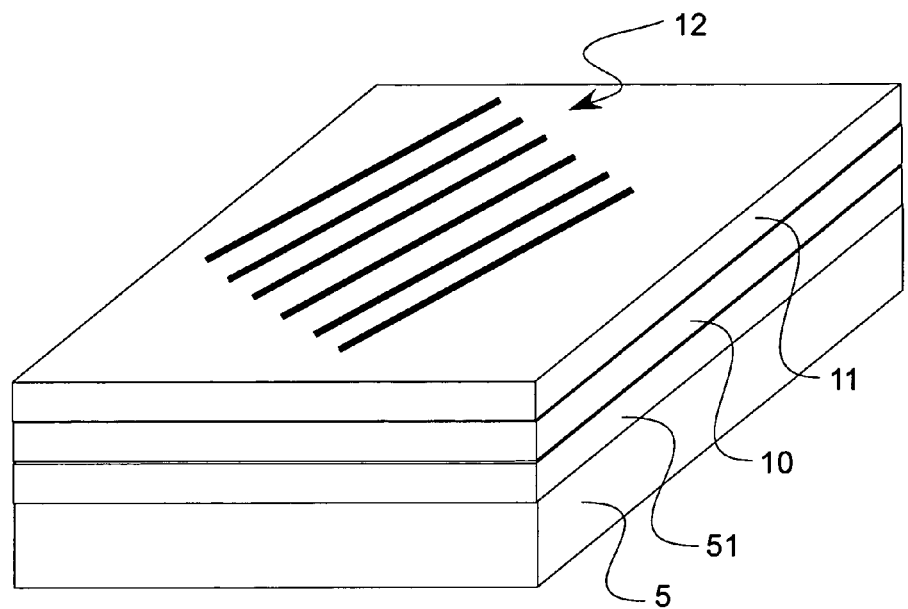
FIGS. 5A-5C illustrate a method for the fabrication of nanostructures within an Si epilayer.

FIG. 5A illustrates the transfer of the Pt nanowires to an epoxy layer. In FIG. 5A, a thin film 10 comprising, preferably, a 20 nm thick single crystal silicon epilayer of a silicon-on-insulator substrate has been formed on a supporting silicon wafer 5. The thin film 10 is separated from the silicon wafer by a preferably 200 nm thick layer 51 of $SiO_2$. A thin layer 11 (preferably 10 nm thick) of heat-curable epoxy is disposed on top of the thin film 10. The Pt nanowires are transferred as an ink by gently dropping them onto the thin heat-curable epoxy layer 11. The epoxy layer 11 coats the thin film 10 from which the final nanowires will emerge. The epoxy formulation (preferably, Epoxy Bond 110; from Allied Tech Products, Ranch Dominguez, Calif.: 10 drops part A to 1 drop part B+0.15 g of 6% polymethylmethacrylate (PMMA) in 20 ml chlorobenzene) helps ensure a high process yield, and the PMMA within the epoxy allows for the SNAP method to be combined with more traditional lithographic patterning methods, such as electron beam lithography.

Figure 5B:
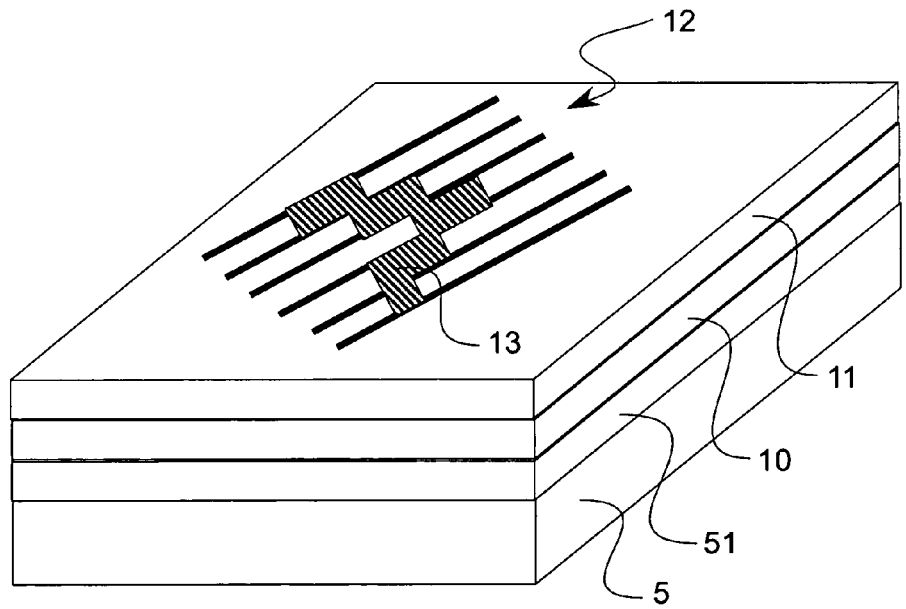

In a typical SNAP process, the Pt NW array may then be pattern-transferred, via reactive ion etching to convert the underlying Si epilayer thin film into a nanowire array. However, according to an embodiment of the present disclosure, an additional patterning step is performed prior to the pattern transfer. FIG. 5B illustrates this additional patterning step. After the Pt nanowire array 12 is deposited, electron beam lithography may be used to generate arbitrarily complex patterns 13 on top of the Pt nanowire array/epoxy thin film 11. After patterning, preferably 20 Å Ti (which serves as an adhesion layer) and 100 Å Pt are deposited. Using methods known in the art, the lithographically written pattern may be developed by lifting off the Ti/Pt deposited film in the non-patterned regions. This results in a two-dimensional film of Pt nanowires 12 and Ti/Pt structures 13. This thin film then serves as an etch mask for translating those structures into the underlying Si epilayer.

Figure 5C:
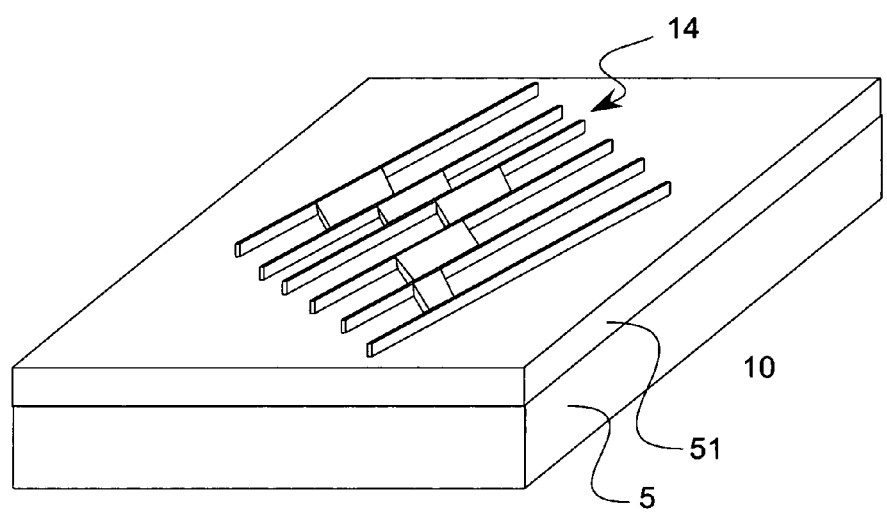

FIG. 5C illustrates the formation of the structures within the Si epilayer. The transfer of the structures to the Si epilayer may be done using a directional dry reactive ion etching tool with $CF_4$ gas etchant. The entire process may be concluded by a final removal of Pt nanowires and Ti/Pt bars in aqua regia ($HCl:HNO_3=3:1$). The resulting structure is a set of Si nanowires that are arbitrarily connected to other ones within the array through in-plane Si routes 14. The contact nature between the nanowires and the routing Si is truly single crystalline as determined by the initial SOI substrate. As discussed above, embodiments of the present disclosure, can be utilized to generate a host of structures for various applications, including monolithic contacts for Si nanowire FETs (discussed below and shown in FIGS. 6A and 6B), suspended Si nanowires structures (discussed below and shown in FIGS. 7A and 7B and arrays of nano-holes in Si as shown in FIGS. 3C and 3D.

Figure 6A:
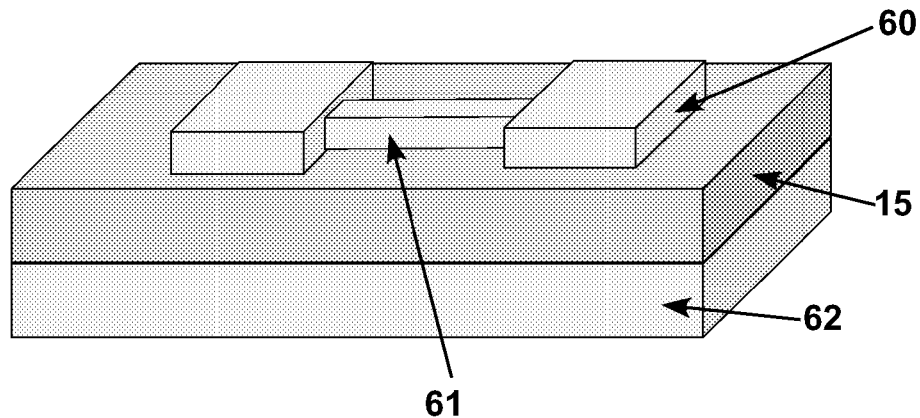
FIGS. 6A-6C illustrate a method for fabricating the FET circuit depicted in FIG. 2.
Figure 6B:
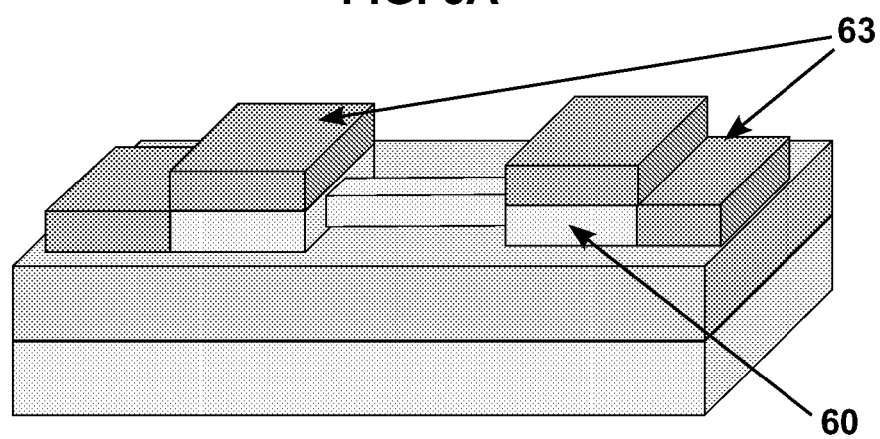
Figure 6C:
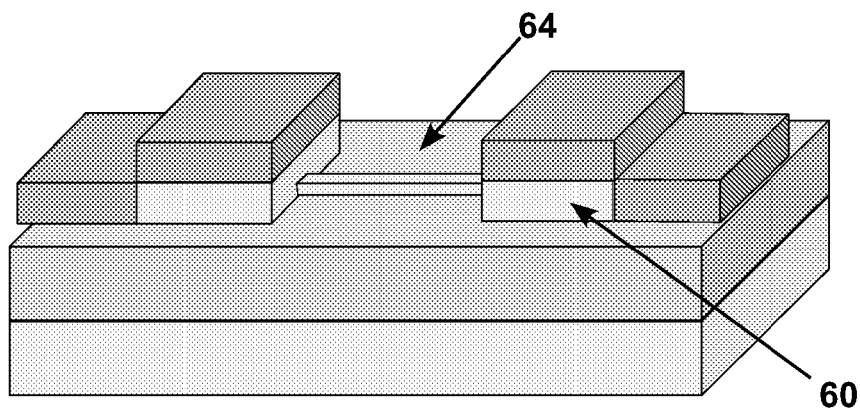

Embodiments of the present disclosure may also be used to fabricate nanowire FETs. FIGS. 6A, 6B and 6C show the fabrication of such a device. Such a device is also illustrated in FIG. 2. FIG. 6C shows the resulting FET, where large Si contact pads 60 are fabricated from the same single crystal silicon epilayer of an SOI substrate as the Si nanowires 64 that serve as the source-drain channels for the FETs. This is desirable for n- and p-type FETs fabrication. It is also desirable to have the large contact pads 60 heavily doped, and the nanowire source-drain channels 61 lightly doped.

FIG. 6A shows the initial steps of the fabrication of the FET. Embodiments of the present disclosure provide for the fabrication of the contact pads 60 and the nanowires in an Si epilayer. Embodiments of the present disclosure provide that the nanowires 61 are connected to the contact pads 60. FIG. 6B shows that the large contact pads 60 may themselves be connected to the outside world by Pt wires 63, with a thin layer of Ti (not shown) preferably sandwiched between the Si epilayer and the Pt wires 63 to promote adhesion of the Pt. Prior to these patterning approaches, the silicon epilayer itself is preferably doped using spin-on-dopants (SODs). The dopants are preferably patterned to produce regions of both p-type Si and n-type Si. For example, to achieve high doping levels (typically on the order of $10^{19}$ $cm^{-3}$) for the contact areas, the SODs may be diffused into the Si epilayer at a temperature of 825° C. with Boron A (available from Filmtronics, Inc., Bulter, Pa.) for the p-type region and 950° C. with Phosphorsilica (available from Emulsitone, Inc., Whippany, N.J.) for the n-type region preparation.

Figure 6D:
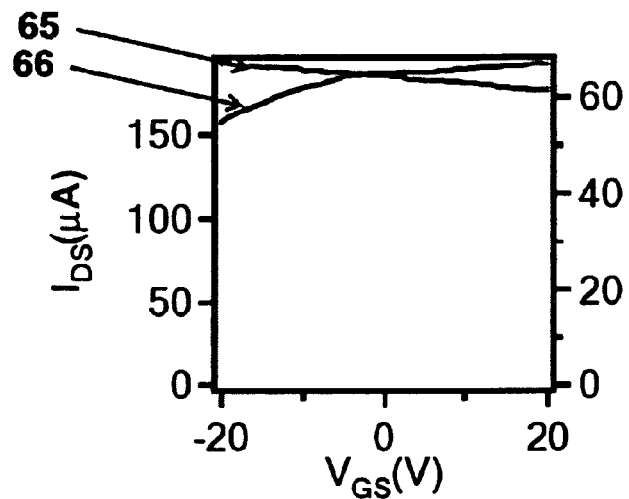
FIGS. 6D and 6E show graphs of drain-source current $I_{DS}$ as a function of gate-source voltage $V_{GS}$.
Figure 6E:
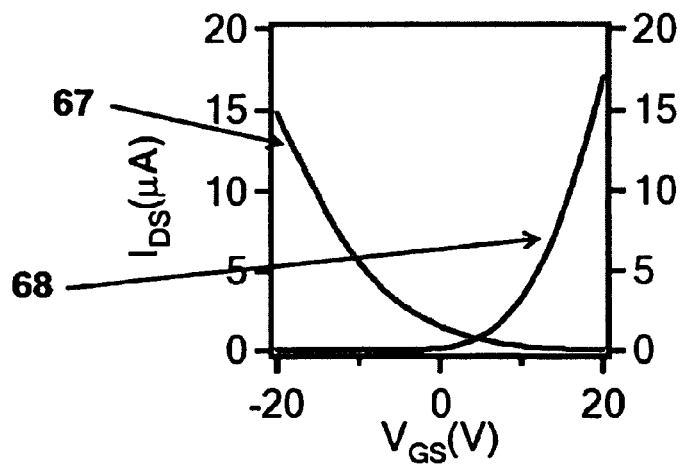

Using such doping techniques provides that the doping profile through the thickness of the Si epilayer decreases from top to bottom, dropping by as much as a factor of 30 from the top surface of the epilayer to 10 nm below that surface. Once the p-type and n-type FETs device structures are achieved, the field-effect responses of the Si nanowires may be characterized using voltage (gate) modulation of the nanowires source-drain channel 61. The underlying Si substrate 62 serves as the gate electrode. An insulating layer 15 may be disposed between the gate electrode and the nanowires source-drain channel 61. Because the Si epilayer is highly doped, the Si nanowires do not exhibit a strong field-modulated response at this point, as shown in FIG. 6D, with the n-FET performance shown at line 66 and the p-FET performance at line 65. However, further etching of the nanowires 61 may provide the desired response. Hence, the structure may be further etched by using, for example, gentle $CF_4$ conditions (13.56 MHz, $CF_4$/He flow rates=20/30 sccm (standard cubic centimeter per minute), pressure=10 mTorr, and power=10 W) for 20-30 s. The Ti/Pt contacts 63 to the Si pads 60 prevent those pads from being etched and so the contact regions 60 stay heavily doped—only the nanowire source-drain channels 61 are etched, and as they are thinned, their doping level rapidly drops. FIG. 6C shows the thinned nanowire source-drain channels 64. Immediately after etching, preferably a forming-gas anneal is performed to passivate surface states generated during the etching process. For example, the anneal may be performed at 475° C. for 5 minutes to achieve the desired results. The devices may then be characterized again and the sequence repeated until a desired gate modulation is obtained. FIG. 6E shows a desired gate modulation of greater than 103 for the p-FETs at line 67 and the n-FETs at line 68.

Figure 7A:
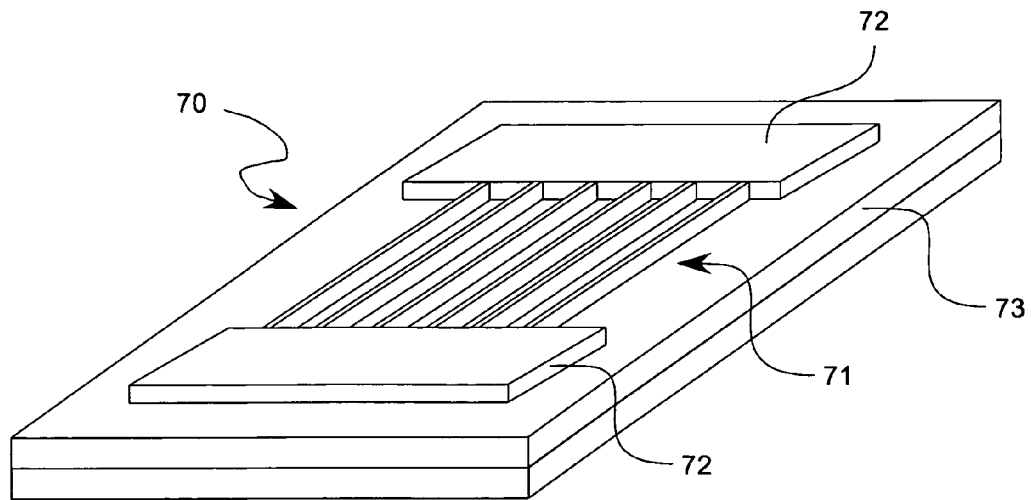
FIGS. 7A and 7B depict a method for forming arrays of suspended nanowires.
Figure 7B:
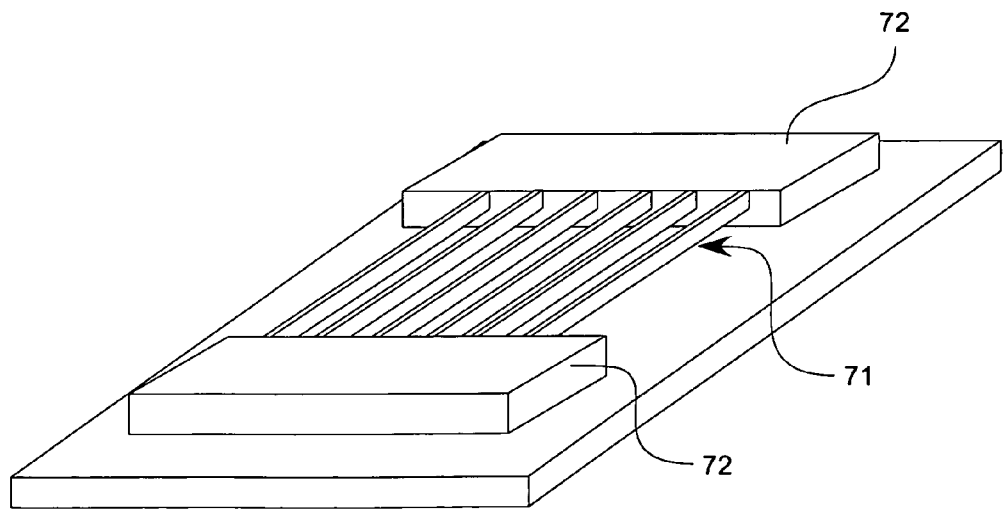

Embodiments of the present disclosure may also be used to generate arrays of suspended nanowires. Similar to the process depicted in FIGS. 6A-6C, a structure 70 comprising an array of nanowires 71 connected to large bars 72 is fabricated within an Si epilayer positioned in top of an $SiO_2$ layer 73 as shown in FIG. 7A. Starting with this structure 70, standard lithographic patterning methods may then be used to define windows over the nanowires 71. For example, PMMA or photoresist may be deposited on top of the large bars 72 and nanowires 71 and windows created in the deposited PMMA or photoresist. Selective etching through those opened windows can be performed using either wet or dry etching methods. Buffered oxide etch (BOE) may serve the purpose for Si nanostructures supported on the $SiO_2$ layer. Once the underlying SiO$_2$ has been etched, the nanowires 71 are released and suspended as shown in FIG. 7B. The photoresist or PMMA may then be removed in a following dry O$_2$ etching step. The larger Si bars 72 on either side of the silicon nanowires 71 maintain the relative positions of the nanowires 71, and prevent them from collapsing together.

Embodiments of the present disclosure may also be used to provide for ultra-high density arrays of nanometer sized holes in Si with tunable sizes and spacings. Returning to FIGS. 3A and 3B, a first set of Pt nanowires 30 may be patterned using the SNAP process or other nanowire techniques known in the art to apply the nanowires to the layer. Then, instead of using lithography to define further structures within the nanowires array, another SNAP process (or other technique known in the art) may be used to lay down a second set of Pt nanowires 31. The relative orientations of the two nanowires sets can be perpendicular, or in an arbitrary angle. CF$_4$ etch may then be used to transfer the crossed nanowires pattern 32 into the Si epilayer. The Pt nanowires may be removed as described above. The resulting holes exhibit diameter that equals the spacing between the Pt nanowires and the distance between the holes is dictated by the width of Pt nanowires. Using this procedure, the diameter and the spacing of the holes can be carefully and precisely controlled.

Figure 8A:
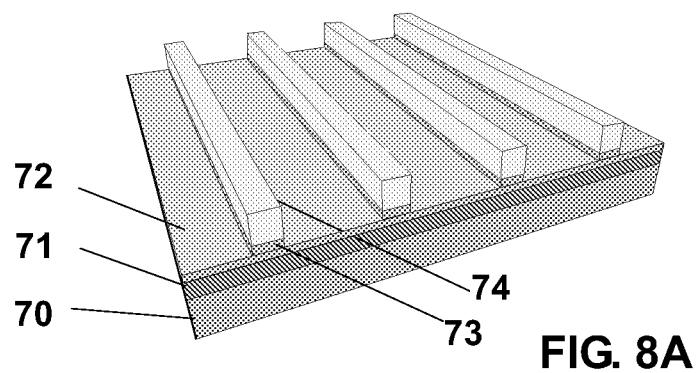
FIGS. 8A-8D depict a method for fabricating superconducting nanowire arrays.

Embodiments of the present disclosure may also be used to prepare superconducting nanowire arrays, with electrical contacts patterned form the same superconducting thin film as the nanowires. As shown in FIG. 8A. an array of SNAP-patterned Pt nanowires 74 are deposited on top of a Nb thin film 71 (preferably 11 nm thick) coated with the epoxy adhesive layer 73 and supported on an SiO$_2$ substrate 70. Nb is the superconducting material from which the final nanowires are formed. Superconducting materials are in general not as stable as the silicon-on-insulator epilayer thin films described previously, and so the protocol used to form the silicon nanowires may need to be modified as discussed below. In particular, the superconducting film 71 is preferably protected with a thin SiO$_2$ layer 72 deposited prior to the application of the nanowires 74. This layer 72 ensures that the superconducting nanowires are well-insulated from the Pt nanowire mask 74.

Figure 8B:
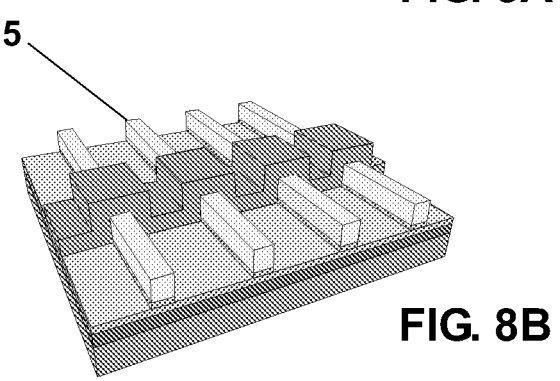
Figure 8C:
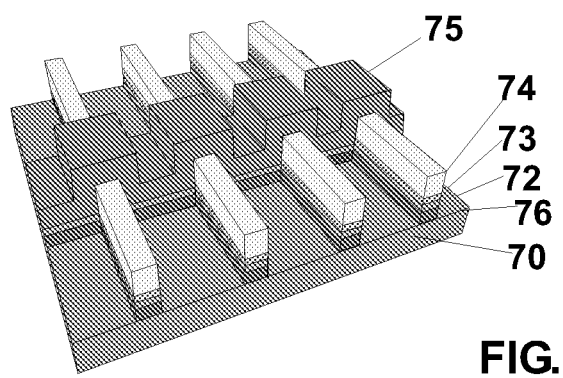
Figure 8D:
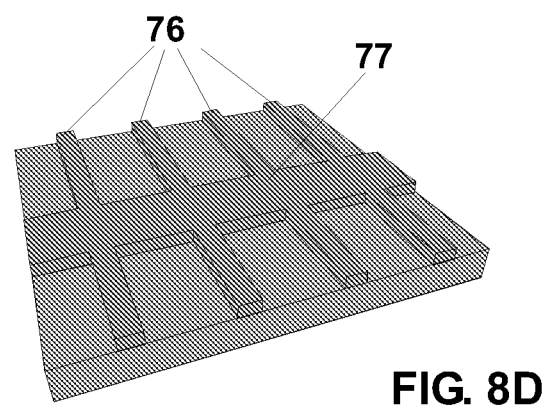

Using the methods described above, the resultant on-chip niobium nanowire array 76 may be integrated with relatively-large electrode pads 77 as shown in FIG. 8D, also made from the same Nb thin film 71. The nanowires are thus connected to contacts made out of the same superconducting film, thus avoiding proximity effects. FIG. 8B illustrates the application of an electrode pad pattern 75 for the formation of the electrode pads 77 shown in FIG. 8D. As shown in FIG. 8C, the combination of the electrode pad pattern 75 and the Pt nanowires 74 serve as a mask for the etching of the superconducting film layer 71. This creates the underlying Nb structure. The Nb structure is protected by the SiO$_2$ film on top. FIG. 8D illustrates the removal of the Pt nanowires 74 and the electrode pad pattern 75 leaving the niobium nanowire array 76 and electrode pads 77. The superconductivity properties of 11 nm wide and 16 nm wide Nb nanowires are presented in Ke Xu and James R. Heath, "Controlled fabrication of long quasi-one-dimensional superconducting nanowire arrays," Nanoletters v. 8, 136-141 (2008).

The foregoing Detailed Description of exemplary and preferred embodiments is presented for purposes of illustration and disclosure in accordance with the requirements of the law. It is not intended to be exhaustive nor to limit the invention to the precise form or forms described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. This disclosure has been made with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising step(s) for . . . ."

The invention claimed is:

1. A method for fabricating two dimensional nanostructures comprising:
    depositing one or more nanowires on a patterning layer, wherein the patterning layer is disposed on a thin film layer;
    forming patterns in the patterning layer to form one or more two-dimensional structures in the patterning layer, the one or more structures comprising the formed patterns and the one or more nanowires;
    pattern transferring the one or more structures to the thin film layer;
    forming one or more complementary structures in the thin film layer based on the pattern transferred structures; and
    removing the patterning layer.

2. The method according to claim 1, wherein the patterning layer comprises a mixture of epoxy and photo-resist material.

3. The method according to claim 2, wherein the patterning layer comprises polymethylmethacrylate.

4. The method according to claim 1, wherein the nanowires comprise Pt nanowires.

5. The method according to claim 1, wherein the formed patterns comprises Ti/Pt structures.

6. The method according to claim 1, wherein pattern transferring the one or more structures to the thin film layer and forming one or more complementary structures comprise reactive ion etching with CF$_4$ gas etchant.

7. The method according to claim 1, wherein the thin film layer comprises a single crystal silicon epilayer of a silicon-on-insulator substrate.

8. The method according to claim 1, wherein the thin film layer comprises a niobium thin film.

9. The method according to claim 1, further comprising doping the thin film layer prior to forming one or more complementary structures in the thin film layer.

10. The method according to claim 1, further comprising etching structures into a layer disposed beneath the thin film layer based on the one or more complementary structures formed in the thin film layer.

11. A method for fabricating two dimensional nanostructures comprising:
- depositing a first nanowire array on a patterning layer, wherein the patterning layer is disposed on a thin film layer and the first nanowire array comprises a plurality of nanowires aligned generally parallel to each other;
- depositing a second nanowire array on top of the first nanowire array and the second nanowire array comprises a plurality of nanowires aligned generally parallel to each other;
- pattern transferring one or more two-dimensional structures resulting from a combination of the first nanowire array and the second nanowire array on the patterning layer to the thin film layer;
- forming one or more complementary structures in the thin film layer based on the pattern transferred two-dimensional structures; and
- removing the patterning layer.

12. The method according to claim 11, further comprising forming one or more patterns in the patterning layer prior to pattern transferring the one or more two-dimensional structures to the thin film layer.

13. The method according to claim 11, wherein the first nanowire array has a first orientation and the second nanowire array has a second orientation and the second nanowire array is deposited on top of the first nanowire array and wherein the first orientation is perpendicular to the second orientation.

14. The method according to claim 11, wherein the first nanowire array and the second nanowire array are deposited in orientations to provide to provide holes in the thin film layer after forming one or more complementary structures in the thin film layer.

15. The method according to claim 14, further comprising forming one or more patterns in the patterning layer prior to pattern transferring the one or more two-dimensional structures to the thin film layer, wherein at least one of the patterns is formed at location defined by at least two adjacent nanowires in the first nanowire array and at least two adjacent nanowires in the second nanowire array.

16. The method according to claim 11, further comprising etching structures into a layer disposed beneath the thin film layer based on the one or more complementary structures formed in the thin film layer.

17. A method for fabricating two dimensional nanostructures comprising:
- depositing one or more nanowires on an adhesion and resist layer, wherein the adhesion and resist layer is disposed on a resulting nanostructure layer;
- forming patterns in the adhesion and resist layer to form one or more two-dimensional structures in the adhesion and resist layer, the one or more structures comprising the formed patterns and the one or more nanowires;
- copying the one or more two-dimensional structures in the adhesion and resist layer to the resulting nanostructure layer; and
- removing material in the resulting nanostructure layer outside of the copied two-dimensional structures.

18. The method according to claim 17, further comprising doping the resultant nanostructure layer prior to copying the one or more two-dimensional structures to the resulting nanostructure layer.

19. The method according to claim 17, wherein the adhesion and resist layer comprises a mixture of epoxy and photoresist material.

20. The method according to claim 17, wherein the nanowires comprise Pt nanowires, and the nanowires are deposited on the adhesion and resist layer as an ink.

21. The method according to claim 17, wherein the resulting nanostructure layer comprises an Si epilayer or a niobium layer.

* * * * *